United States Patent
Ou

(10) Patent No.: US 8,341,334 B2
(45) Date of Patent: Dec. 25, 2012

(54) FLASH MEMORY APPARATUS AND METHOD FOR OPERATING THE SAME AND DATA STORAGE SYSTEM

(75) Inventor: Hsu-Ping Ou, Zhubei (TW)

(73) Assignee: Silicon Motion, Inc., Jhubei (TW)

( * ) Notice: Subject to any disclaimer, the term of this patent is extended or adjusted under 35 U.S.C. 154(b) by 273 days.

(21) Appl. No.: 12/577,158

(22) Filed: Oct. 10, 2009

(65) Prior Publication Data

US 2010/0332731 A1  Dec. 30, 2010

(30) Foreign Application Priority Data

Jun. 26, 2009 (TW) ............... 98121562 A

(51) Int. Cl.
*G06F 12/00* (2006.01)
(52) U.S. Cl. ........................... 711/103; 711/154
(58) Field of Classification Search ........... 711/103, 711/154
See application file for complete search history.

(56) References Cited

U.S. PATENT DOCUMENTS

| | | | | |
|---|---|---|---|---|
| 7,209,252 B2 * | 4/2007 | Owens et al. | ............... | 358/1.15 |
| 2008/0052448 A1 * | 2/2008 | Minz et al. | ............... | 711/103 |
| 2010/0162053 A1 * | 6/2010 | Gillingham | ............... | 714/49 |

FOREIGN PATENT DOCUMENTS

| | | |
|---|---|---|
| CN | 1716371 A | 1/2006 |
| CN | 100446126 C | 12/2008 |
| EP | 1744252 A2 | 1/2007 |

OTHER PUBLICATIONS

Office Action of corresponding CN patent application, issued on Jun. 24, 2011.

* cited by examiner

*Primary Examiner* — Matthew Bradley
(74) *Attorney, Agent, or Firm* — Wang Law Firm, Inc.; Li K. Wang; Stephen Hsu

(57) ABSTRACT

A flash memory apparatus is provided. In one embodiment, the flash memory apparatus with a plurality of operation states is coupled to a host and includes a controller having an engine and a register array. A state machine logic circuit of the engine is provided for transition of the operation states and the register array provides state transition information. When a command is received from the host, the engine obtains the state transition information from the register array according to a first operation state and determines whether the valid command is one of a plurality of valid commands corresponding to the first operation state. The state machine logic circuit determines transition to the operation states according to the state transition information. The transition of the first operation state to the second operation state is performed in response to the valid command.

15 Claims, 4 Drawing Sheets

| index | current operation state | valid command | next operation state | response | interrupt |
|---|---|---|---|---|---|
| 1 | STBY | CMD7 | TRAN | R1 | NO |
| 2 | STBY | CMD13 | STBY | R2 | NO |
| 3 | reserved | reserved | reserved | reserved | reserved |
| ⋮ | ⋮ | ⋮ | ⋮ | ⋮ | ⋮ |
| 17 | TRAN | CMD8 | DATA | R7 | NO |
| 18 | TRAN | CMD56(r) | DATA | R1 | NO |
| 19 | TRAN | CMD12 | TRAN | R1B | NO |
| 20 | TRAN | CMD13 | TRAN | R2 | NO |
| 21 | TRAN | CMD16 | TRAN | R1 | YES |
| 22 | TRAN | CMD56(w) | RCV | R1 | NO |
| 23 | TRAN | CMD6 | PRG | R1 | NO |
| 24 | TRAN | CMD7 | STBY | R1 | NO |
| 25 | reserved | reserved | reserved | reserved | reserved |
| ⋮ | ⋮ | ⋮ | ⋮ | ⋮ | ⋮ |
| 33 | DATA | CMD13 | DATA | R2 | NO |
| 34 | DATA | CMD12 | TRAN | R1B | NO |
| 35 | reserved | reserved | reserved | reserved | reserved |
| ⋮ | ⋮ | ⋮ | ⋮ | ⋮ | ⋮ |
| 49 | RCV | CMD13 | RCV | R2 | NO |
| 50 | RCV | CMD12 | PRG | R1B | NO |
| 51 | reserved | reserved | reserved | reserved | reserved |
| ⋮ | ⋮ | ⋮ | ⋮ | ⋮ | ⋮ |
| 65 | PRG | CMD12 | PRG | R1B | NO |
| 66 | PRG | CMD13 | PRG | R2 | NO |
| 67 | reserved | reserved | reserved | reserved | reserved |
| ⋮ | ⋮ | ⋮ | ⋮ | ⋮ | ⋮ |
| 80 | reserved | reserved | reserved | reserved | reserved |

FIG. 3

FLASH MEMORY APPARATUS AND METHOD FOR OPERATING THE SAME AND DATA STORAGE SYSTEM

CROSS REFERENCE TO RELATED APPLICATIONS

This application claims priority of Taiwan Patent Application No. 098121562, filed on Jun. 26, 2009, the entirety of which is incorporated by reference herein.

BACKGROUND OF THE INVENTION

1. Field of the Invention

The invention relates to flash memories, and more particularly to flash memory apparatuses, methods for operating the same and data storage systems.

2. Description of the Related Art

Flash memories, which may keep stored data without power supply voltage applied thereto, have advantages such as speedy operation and low power consumption. Thus, flash memories are commonly applied as storage media, e.g., memory cards and pen drives, for various electronic products, such as mobile phones, digital cameras, personal digital assistants (PDA), and notebook computers.

Generally, when a flash memory apparatus with a flash memory (such as a memory card) is coupled to a host (such as a mobile phone), the host operates the flash memory apparatus by sending various defined commands of the memory card. That is, a controller in the flash memory apparatus may perform transition of operation states of the flash memory apparatus according to commands sent from the host, thereby performing operations of parameter configuration or data transmission. Conventionally, a state machine is implemented in a flash memory apparatus for executing various commands defined in the memory card specification and performing transition of the operation states. Further, logic circuits for operating the state machine may be configured by use of programming tools, such as Verilog languages, to become a specialized integrated circuit after tape-out process.

However, after the tape-out process, a specialized integrated circuit may not be able to be directly modified when the memory card specification is revised. In this case, it is necessary for the Verilog language to be revised and modify the logic circuits for operating the state machine to again, perform the tape-out process. Thus, the method is inflexibility, time-consuming, and increases the cost for the tape-out process.

Therefore, it is desirable to provide an improved flash memory apparatus and an operating method thereof, capable of being modified more flexibly based on memory card specification revisions without further modifying the logic circuits and performing the tape-out process.

BRIEF SUMMARY OF THE INVENTION

The invention provides a flash memory apparatus. In an embodiment, the flash memory apparatus is coupled to a host and comprises a plurality of operation states. The flash memory apparatus comprises a controller having an engine and a register array. The engine comprises a state machine logic circuit for transition of the operation states. The register array provides state transition information. When a command is received from the host, the engine obtains the state transition information from the register array according to a first operation state for determining whether the valid command is one of a plurality of valid commands corresponding to the first operation state. Additionally, the state machine logic circuit determines transition of the operation states according to the state transition information for transition from the first operation state to a second operation state in response to the valid command.

In another embodiment, the invention provides a method for operating a flash memory apparatus. The flash memory apparatus is coupled to a host and comprises a plurality of operation states. The method for operating the flash memory apparatus comprises the steps of: receiving a command from the host; reading a register array having state transition information according to a first operation state for determining whether the valid command is one of a plurality of valid commands corresponding to the first operation state; and when the valid command is one of the valid commands corresponding to the first operation state, a state machine logic circuit of the flash memory apparatus determines transition of the operation states according to the state transition information of the register array for transition from a first operation state to a second operation state in response to the valid command.

In another embodiment, the invention provides a data storage system. The data storage system comprises a host and a flash memory apparatus. The host transmits a plurality of commands to access data. The flash memory apparatus coupled to the host comprises a plurality of operation states. The flash memory apparatus receives a command from the host and reads a register array having state transition information according to a first operation state for determining whether the valid command is one of a plurality of valid commands corresponding to the first operation state. When the valid command is one of the valid commands corresponding to the first operation state, a state machine logic circuit of the flash memory apparatus determines transition of the operation states according to the state transition information of the register array for transition from the first operation state to a second operation state in response to the valid command.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 is a state transition table for the flash memory apparatus of FIG. 1.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
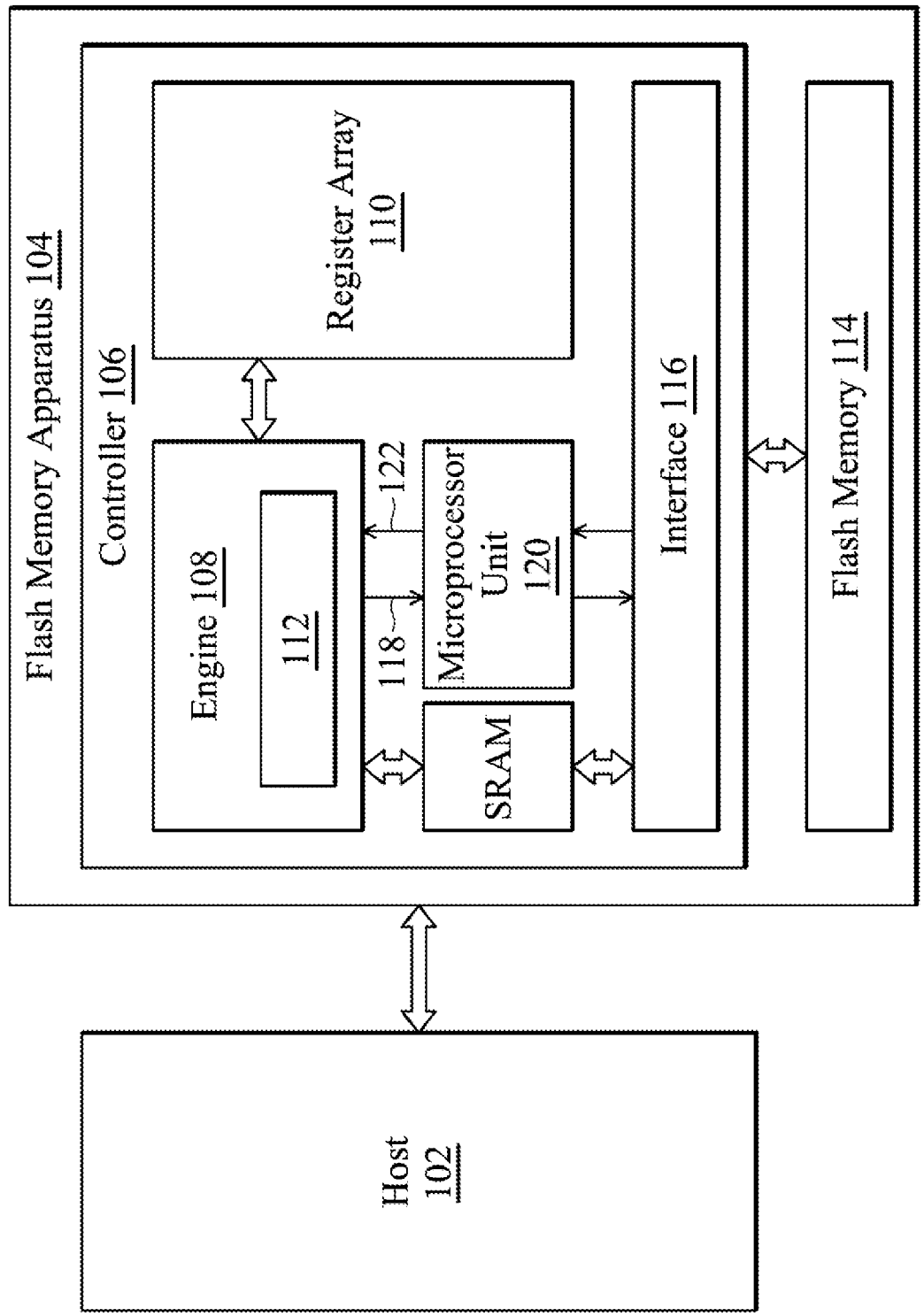
FIG. 1 is a block diagram illustrating a data storage system according to an embodiment of the invention.

FIG. 1 is a block diagram illustrating a data storage system 10 according to an embodiment of the invention.

Referring to FIG. 1, the data storage system comprises a host 102 and a flash memory apparatus 104. In an embodiment, the host 102 may be a portable device, such as a mobile phone, and the flash memory apparatus 104 coupled to the host 102 may be a memory card, such as security digital card (SD card). According to the memory card specification, the host 102 transmits a plurality of commands to the flash memory apparatus 104 for data transmission with the flash memory apparatus 104. The flash memory apparatus 104 comprises a plurality of operation states, such as a standby state, a data transmission state, a data receiving state, and so on. During operation, when the flash memory apparatus 104 receives the valid commands from the host 102, it then transits to the corresponding operation state.

Further, the flash memory apparatus 104 comprises a controller 106 and a flash memory 114. As shown in FIG. 1, the controller 106 comprises an engine 108 and a register array 110, and the flash memory 114 is coupled to the controller 106. According to the embodiment, the engine 108 comprises a state machine logic circuit 112 for transition of the operation states according to state transition information provided by the register array 110. In an embodiment, the register array 110 comprises a plurality of register elements (not shown) and establishes content of the register elements according to the state transition information. For example, when the flash memory apparatus 104 is powered on, the state transition information may be loaded from the flash memory 114 into the register array 110 via an interface 116. Then, when the memory card specification is revised, such as a new command is performed, the state transition information stored in the flash memory 114 may be accordingly modified. Further, the updated state transition information is loaded again from the flash memory 114 into the register array 110 upon a subsequent power-up operation, as will be described below with reference to FIGS. 2 and 3.

Figure 2:
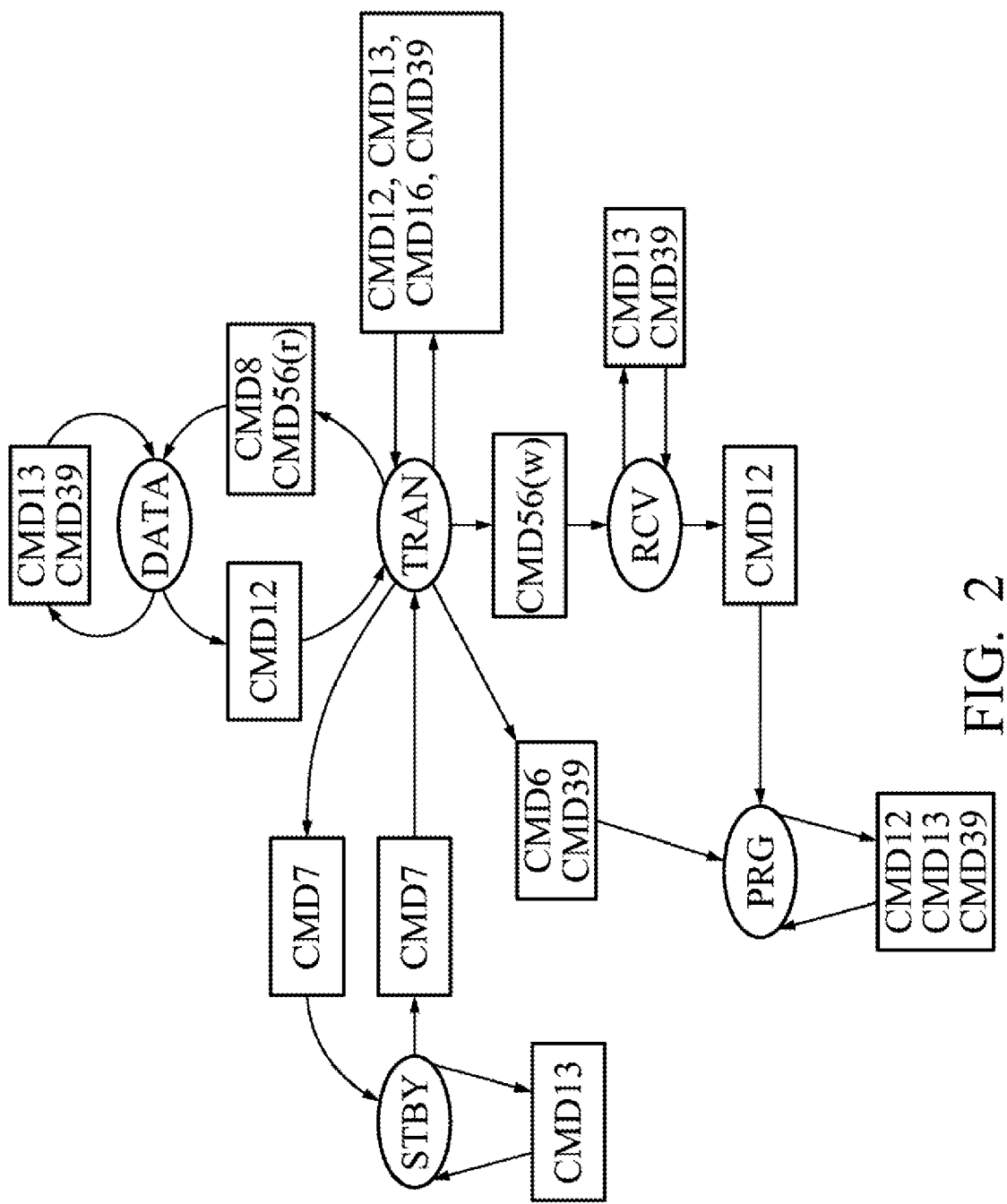
FIG. 2 is a diagram illustrating operation states and transition thereof for the flash memory apparatus of FIG. 1.

FIG. 2 is a diagram illustrating the operation states and transition thereof for the flash memory apparatus 104 of FIG. 1. FIG. 3 is a state transition table for the flash memory apparatus 104 of FIG. 1. In an embodiment, the state transition table is stored in the flash memory 114 of FIG. 1.

Referring to FIGS. 1 and 2, the flash memory apparatus 104 operates between 5 operation states, but the invention is not limited thereto. The operation states are a standby state STBY, a data transmission state DATA, a data receiving state RCV, a transmission state TRAN, and a programming state PRG. As shown in FIG. 3, the state transition information includes a set of valid commands corresponding to a current operation state. Further, the state transition information also includes a next operation state corresponding each of the set of valid commands.

For example, when the flash memory apparatus 104 receives a command from the host 102, the engine 108 determines the current operation state of the flash memory apparatus 104. Assuming the flash memory apparatus 104 is operating in a data transmission state DATA, a microprocessor unit 120 reads the flash memory 114 via the interface 116, stores the read data into an SRAM, and then transmits the read data to the host 102. Afterwards, when the data transmission state DATA is determined, the engine 108 obtains the state transition information of the register array 110, e.g., index 33 and 34 as shown in FIG. 3. Then, the engine 108 determines whether the received command is one of valid commands corresponding to the data transmission state DATA. That is, the engine 108 determines whether the received command is a valid command CMD13 of index 33 or a valid command CMD12 of index 34.

According to an embodiment, when a command issued by the host 102 is invalid, the flash memory apparatus 104 may directly ignore the valid command without further processes, wherein the operation state is unchanged.

Moreover, when the received command is one of valid commands corresponding to the transmission state DATA, such as CMD12 of index 34, the state machine logic circuit 112 further determines the next operation state according to index 34. That is, the transition of the operation state of the flash memory apparatus 104 is from the data transmission state DATA to the transmission state TRAN in response to the received valid command CMD12, as shown in FIG. 2.

Additionally, upon transition to the transmission state TRAN, the controller 106 responds to the host 102 with a response R1B. The response R1B corresponds to the data transmission state DATA and the received command. During operation, various types of responses may be assigned according to requirements, e.g., R1, R2, and R1B as shown in FIG. 3. For example, when the host 102 transmits CMD12 to operate the flash memory 114 and stop data transmission, the response RIB is used to respond to the host 102 and inform the host 102 that a period of time is required to handle the valid command CMD12.

It is noted that when the valid command is received from the host 102, the engine 108 may directly obtain the content of the register array 110 according to the current operation state, rather than obtaining the state transition information, by use of addresses, so as to achieve a minimum waiting time. Thus, meeting requirements for allowable response time defined by the memory card specification. Moreover, the register elements of the register array 110 may be obtained in parallel for determining whether the valid command from the host 102 is valid. Thus, improving performance of accessing the register array 110.

Specifically, for each operation state, additional indexes and columns may be reserved in the state transition table in FIG. 3, e.g., index 3, 25, and 35 as shown in FIG. 3, for the memory card specification revisions. According to some embodiments, the number of additional indexes and columns may be flexible and adjusted for different operation states, for example, the number of the additional indexes and columns reserved for the transmission state TRAN may be larger than other operation states. Referring to FIG. 3, assume that each index requires 3 bits of register space, thus 80 indexes require 240 bits of register space. In this regard, the corresponding register elements are allocated within the register array 110 according to 240 bits of register space.

Upon transition of the operation states, the flash memory apparatus 104 may further perform an interrupt operation. For example, assume that the flash memory apparatus 104 is operating in the transmission state TRAN and receives the valid command CMD16 from the host 102. According to the embodiment, a command CMD16 is used to configure a block length of the flash memory 114. Referring to index 21 of FIGS. 2 and 3, the transmission state TRAN of the flash memory apparatus 104 is unchanged upon receiving the valid command CMD16 and the engine 108 issues an interrupt signal 118 to the microprocessor unit 120 to configure the block length. In response to the interrupt signal 118, the microprocessor unit 120 may respond to the engine 108 with a corresponding control signal 122. For example, when the interrupt signal 118 triggers the microprocessor unit 120, the microprocessor unit 120 may set the control signal 122 to a busy state. After the configuration of the block length is completed, the control signal 122 may be set to a ready state. En one embodiment, the microprocessor unit 120 may be an 8051 single chip processor.

In an embodiment, when the memory-card specification is revised, such as a card-lock command for security management is added, i.e., adding a command CMD39 as shown in FIG. 2, the state transition information stored in the flash memory 114 is required to be updated. Specifically, new added commands are sequentially added into the reserved indexes and columns of the state transition table as shown in FIG. 3. Next, when the flash memory apparatus 104 is rebooted, the microprocessor unit 120 fetches the in-system programming (ISP) code from the flash memory 114 to determine whether any updated state transition information is included and load the updated state transition information from the flash memory 114 into the register array 110 via the interface 116, so as to update the state transition of the state machine logic circuit 112. As such, it is unnecessary to modify the logic circuits to operate the state machine and perform the tape-out process.

Figure 4:
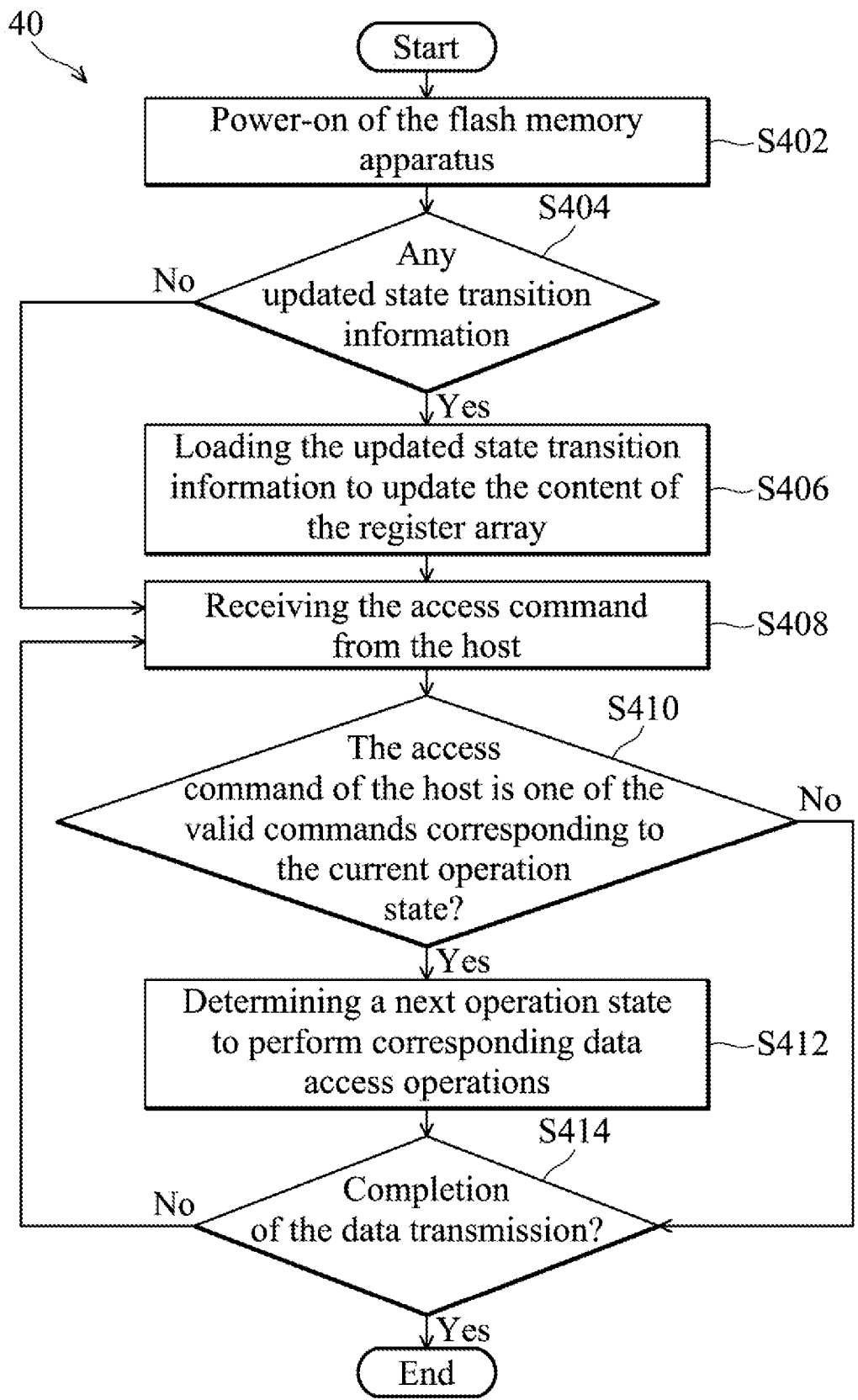
FIG. 4 is a flowchart illustrating a method for operating a flash memory apparatus according to the embodiment of the invention.

FIG. 4 is a flowchart illustrating a method 40 for operating a flash memory apparatus according to the embodiment of the invention.

As shown in FIG. 1, the flash memory apparatus 104 includes the operation states. When the flash memory apparatus 104 is coupled to the host 102, the host 102 issues a series of access commands for data transmission with the flash memory apparatus 104.

Specifically, when the flash memory apparatus 104 is powered on (step S402), the controller 106 determines whether any updated state transition information exists (step S404).

In an embodiment, when the state transition information has been modified, the controller 106 loads the modified state transition information from the flash memory 114 to update the content of the register array 110 (step S406). Moreover, when the state transition information stored in the flash memory 114 is unchanged, it is not necessary to update the content of the register array 110.

Following, when the flash memory apparatus 104 receives an access command from the host 102 (step S408), the controller 106 reads the register array 110 according to the current operation state, e.g., a data transmission state DATA as shown in FIG. 2, for determining whether the access command is one of the valid commands corresponding to the current operation state (step S410), e.g., a valid command CMD13 of index 33 or a valid command CMD12 of index 34 as shown in FIG. 2.

Moreover, when the access command is not one of the valid commands CMD13 or CMD12 corresponding to the data transmission state DATA, then the flash memory apparatus 104 ignores the access command. In addition, when the access command is a valid command, such as CMD12, then the state machine logic circuit 112 determines a next operation state according to the current operation state and the state transition information of the register array 110 and performs corresponding data access operations (step S412). For example, as shown in FIGS. 2 and 3, assuming that the current operation state of the flash memory apparatus 104 is in the data transmission state DATA, the transition to the next operation state of the flash memory apparatus 104 is the transmission state TRAN, in response to the access command CMD12 from the host 102. From the aforementioned description, upon transition to the transmission state TRAN, the flash memory apparatus 104 may correspondingly respond to the host 102 with a predetermined response. Additionally, the flash memory apparatus 104 may perform a relative interrupt operation.

After the access command CMD12 from the host 102 is processed, the flash memory apparatus 104 determines whether the data transmission is completed (step S414). When the data transmission proceeds, the flash memory apparatus 104 then receives a next access command from the host 102 (step S408). When the data transmission is completed, the operating method 40 may end.

The flash memory apparatus and operating method thereof according to an embodiment of the invention is used to control the state machine logic circuit of the flash memory apparatus via the register array, thereby improving design flexibility of the flash memory apparatus. When the memory card specification is revised, transition of the operation states for the state machine logic circuit is operated by modifying the content of the register array, without further modifying the logic circuits and performing the tape-out process of integrated circuits.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A flash memory apparatus, which is coupled to a host and comprises a plurality of operation states, comprising:
   a controller, having an engine and a register array, wherein the engine comprises a state machine logic circuit for transition of the operation states, and the register array provides state transition information,
   wherein when a command is received from the host, the engine obtains the state transition information of the register array according to a first operation state for determining whether the valid command is one of a plurality of valid commands corresponding to the first operation state, and the state machine logic circuit determines transition of the operation states according to the state transition information for transition from the first operation state to a second operation state in response to the valid command, wherein the controller performs an interrupt operation upon transition to the second operation state.

2. The flash memory apparatus as claimed in claim 1, further comprising:
   a flash memory coupled to the controller for storing the state transition information being updated,
   wherein the updated state transition information is loaded from the flash memory into the register array upon a subsequent power-up operation.

3. The flash memory apparatus as claimed in claim 1, wherein the state transition information comprises the valid commands corresponding to the first operation state and the second operation state corresponding to each valid command.

4. The flash memory apparatus as claimed in claim 1, wherein the register array comprises a plurality of register elements, and the engine reads the register elements in parallel according to the first operation state for determining whether the valid command is one of the valid commands corresponding to the first operation state.

5. The flash memory apparatus as claimed in claim 3, wherein when the controller responds to the host with a predetermined response upon transition to the second operation state, the predetermined response corresponds to the first operation state and the valid command.

6. A method for operating a flash memory apparatus, which is coupled to a host and comprises a plurality of operation states, comprising:
   receiving a command from the host;
   reading a register array having state transition information according to a first operation state for determining whether the valid command is one of a plurality of valid commands corresponding to the first operation state; and when the valid command is one of the valid commands corresponding to the first operation state, a state machine logic circuit of the flash memory apparatus determines transition of the operation states according to the state transition information of the register array for transition from a first operation state to a second operation state in response to the valid command, wherein the flash memory apparatus performs an interrupt operation upon transition to the second operation state.

7. The method as claimed in claim 6, further comprises:
storing the state transition information being updated in a flash memory of the flash memory apparatus; and
loading the updated state transition information from the flash memory into the register array upon a subsequent power-up operation.

8. The method as claimed in claim 6, wherein the state transition information comprises the valid commands corresponding to the first operation state and the second operation state corresponding to each valid command.

9. The method as claimed in claim 6, wherein the register array comprises a plurality of register elements being read in parallel according to the first operation state for determining whether the valid command is one of the valid commands corresponding to the first operation state.

10. The method as claimed in claim 8, wherein a predetermined response, corresponding to the first operation state and the valid command, is performed upon transition to the second operation state.

11. A data storage system, comprising:
a host for transmitting a plurality of commands to access data; and
a flash memory apparatus coupled to the host and having a plurality of operation states, wherein the flash memory apparatus receives a command from the host and reads a register array having state transition information according to a first operation state for determining whether the valid command is one of a plurality of valid commands corresponding to the first operation state, and when the valid command is one of the valid commands corresponding to the first operation state, a state machine logic circuit of the flash memory apparatus determines transition of the operation states according to the state transition information of the register array for transition from the first operation state to a second operation state in response to the valid command, wherein the flash memory apparatus performs an interrupt operation upon transition to the second operation state.

12. The data storage system as claimed in claim 11, wherein the state transition information being updated is stored in a flash memory of the flash memory apparatus, and the updated state transition information is loaded from the flash memory apparatus into the register array upon a subsequent power-up operation.

13. The data storage system as claimed in claim 11, wherein the state transition information comprises the valid commands corresponding to the first operation state and the second operation state corresponding to each valid command.

14. The data storage system as claimed in claim 11, wherein the register array comprises a plurality of register elements being read in parallel according to the first operation state for determining whether the valid command is one of the valid commands corresponding to the first operation state.

15. The data storage system as claimed in claim 13, wherein the controller responds to the host with a predetermined response corresponding to the first operation state and the valid command upon transition to the second operation state.

* * * * *